United States Patent
Autumn et al.

(10) Patent No.: US 7,476,982 B2
(45) Date of Patent: Jan. 13, 2009

(54) FABRICATED ADHESIVE MICROSTRUCTURES FOR MAKING AN ELECTRICAL CONNECTION

(75) Inventors: Kellar Autumn, Portland, OR (US); Ronald S. Fearing, El Cerrito, CA (US); Steven D. Jones, Lafayette, CA (US)

(73) Assignee: Regents of the University of California, Oakland, CA (US)

( * ) Notice: Subject to any disclaimer, the term of this patent is extended or adjusted under 35 U.S.C. 154(b) by 0 days.

(21) Appl. No.: 11/365,094

(22) Filed: Feb. 28, 2006

(65) Prior Publication Data

US 2008/0308953 A1   Dec. 18, 2008

Related U.S. Application Data

(60) Provisional application No. 60/657,665, filed on Feb. 28, 2005.

(51) Int. Cl.
*H01L 23/48* (2006.01)

(52) U.S. Cl. .............. 257/783; 257/E23.101; 257/E23.112; 257/E23.089; 257/E23.067; 257/E23.069; 257/734; 257/778

(58) Field of Classification Search ........ 257/783, 257/E23.101, E23.112, E23.089, E23.067, 257/E23.069, 734, 778
See application file for complete search history.

(56) References Cited

U.S. PATENT DOCUMENTS

| | | | |
|---|---|---|---|
| 3,669,823 A * | 6/1972 | Wood ................. | 442/333 |
| 4,545,831 A | 10/1985 | Ornstein | |
| 5,264,722 A | 11/1993 | Tonucci et al. | |
| 5,392,498 A | 2/1995 | Goulait et al. | |
| 5,729,423 A * | 3/1998 | Donde et al. .............. | 361/234 |
| 5,843,657 A | 12/1998 | Liotta et al. | |
| 5,843,767 A | 12/1998 | Beattie | |
| 5,951,931 A | 9/1999 | Murasaki et al. | |
| 5,959,200 A | 9/1999 | Chui et al. | |
| 6,055,680 A | 5/2000 | Tolbert | |
| 6,393,327 B1 | 5/2002 | Scribner | |
| 6,432,744 B1 * | 8/2002 | Amador et al. .............. | 438/108 |
| 6,713,151 B1 | 3/2004 | Dean et al. | |
| 6,722,026 B1 | 4/2004 | Lent | |
| 6,730,541 B2 * | 5/2004 | Heinen et al. .............. | 438/108 |
| 6,737,160 B1 | 5/2004 | Full et al. | |

(Continued)

FOREIGN PATENT DOCUMENTS

WO   WO-99/32005 A1   7/1999

(Continued)

OTHER PUBLICATIONS

Autumn, K. et al. (Jun. 2000). "Adhesive Force of a Single Gecko Foot-Hair," *Nature* 405;681-685.

(Continued)

*Primary Examiner*—Alexander O Williams
(74) *Attorney, Agent, or Firm*—Morrison & Foerster LLP

(57) ABSTRACT

An integrated circuit chip has one or more electrically conductive nano-fibers formed on one or more contact pads of the integrated circuit chip. The one or more electrically conductive nano-fibers are configured to provide an adhesive force by intermolecular forces and establish an electrical connection with one or more contact pads disposed on the surface of a chip package.

13 Claims, 4 Drawing Sheets

U.S. PATENT DOCUMENTS

| | | | |
|---|---|---|---|
| 6,872,439 | B2 | 3/2005 | Fearing |
| 7,011,723 | B2 | 3/2006 | Full et al. |
| 7,057,881 | B2 * | 6/2006 | Chow et al. ............... 361/508 |
| 7,074,294 | B2 * | 7/2006 | Dubrow ...................... 156/276 |
| 7,109,581 | B2 * | 9/2006 | Dangelo et al. ............ 257/720 |
| 7,132,161 | B2 | 11/2006 | Knowles et al. |
| 7,144,624 | B2 | 12/2006 | Knowles et al. |
| 7,169,250 | B2 * | 1/2007 | Kim et al. ................... 156/290 |
| 7,175,723 | B2 * | 2/2007 | Jones et al. ................... 156/60 |
| 7,229,685 | B2 | 6/2007 | Full et al. |
| 2001/0044197 | A1 * | 11/2001 | Heinen et al. ............... 438/612 |
| 2002/0012482 | A1 * | 1/2002 | Pridgeon ..................... 384/36 |
| 2003/0124312 | A1 | 7/2003 | Autumn |
| 2004/0009353 | A1 | 1/2004 | Knowles et al. |
| 2004/0076822 | A1 | 4/2004 | Jagota et al. |
| 2005/0119640 | A1 | 6/2005 | Sverduk et al. |
| 2005/0181170 | A1 | 8/2005 | Fearing et al. |
| 2006/0068107 | A1 * | 3/2006 | Madou et al. ............ 427/249.1 |
| 2006/0078725 | A1 | 4/2006 | Fearing et al. |
| 2006/0202355 | A1 * | 9/2006 | Majidi et al. ................ 257/783 |

FOREIGN PATENT DOCUMENTS

| | | |
|---|---|---|
| WO | WO-01/49776 A2 | 7/2001 |
| WO | WO-03095190 A2 | 11/2003 |
| WO | WO-2005/033237 A2 | 4/2005 |
| WO | 2006/060149 A2 * | 6/2006 |
| WO | WO-2006/130864 A2 | 12/2006 |
| WO | WO-2007/040563 A2 | 4/2007 |

OTHER PUBLICATIONS

Cartmill, M. (1985). "Climbing" Chapter 4 *In Functional Vertebrate Morphology*. Hildebrand, M. et al. eds., The Belknap Press of Harvard University Press: Cambridge, MA, pp. 73-88.

Edwards, J. S. (Oct. 1962). "Observations on the Development and Predatory Habit of Two Reduviid heteroptera, Rhinocoris carmelita stal and Piatymeris rhadamanthus gerst," *The Proceedings of the Royal Entomological Society of London* 37:89-98.

Edwards, J. S. et al. (1970). "The Adhesive Pads of Heteroptera: A Re-Examination," *The proceedings of the Royal Entomological Society of London* 45:1-5.

Hora, S. L. (1923). "The Adhesive Apparatus on the Toes of certain Geckos and Tree-frogs," *Journal of the Asiatic Society of Bengal* 9:137-145.

Irschick, D. J. et al. (1996). "A Comparative Analysis of Clinging Ability Among Pad-Bearing Lizards," *Biological Journal of the Linnean Society* 59:21-35.

Janra (Oct. 18, 2002). "Gecko Feet In-Hair-Ently Sticky (Science)," located at <http://www.kuro5shin.org/?op=displaystory;sd=2002/10/18/03840/816> visited on Nov. 17, 2005. (12 pages).

Liang, Y. A. et al. (Jun. 2000). "Adhesion Force Measurements on Single Gecko Setae," Technical Digest of the 2000 Solid-State Sensor and Actuator Workshop, Hilton Head Island, SC, pp. 33-38.

Maderson, P. F. A. (Aug. 1964). "Keratinized Epidermal Derivatives as an Aid to Climbing in Gekkonid Lizards," *Nature* 203:780-781.

Mahendra, B. C. (1941). "Contributions to the Bionomics, Anatomy, Reproduction and Development of the Indian House-Gecko, Hemidactylus Flaviviridis Ruppel." *Proceedings of the Indian Academy of Science*, pp. 288-306.

Paul, R. C. (Oct. 1999). "How Do Files and Other Insects Walk Up Walls, Ceilings and Even Apparently Smooth Glass Windows?," located at <http://www.sciam.com/askexpert$_{13}$question.cfm?articleID×00053735-601D-1C72-9EB7809EC588F2D7> visited on Jun. 15, 2007. (3 pages).

Peterson, J. A. et al. (Jul. 1981). "A Case History in Retrograde Evolution: The Onca Lineage in Anoline Lizards. II. Subdigital Fine Structure," *Bulletin of the Museum of Comparative Zoology* 149(4):215-268.

Ruibal, R. et al. (Nov. 1965). "The Structure of the Digital Setae of Lizards," *Journal of Morphology* 117:271-294.

Russell, A. P. (1975). "Contribution to the functional Analysis of the Foot of the Tokay, Gekko gecko (Reptilia: Gekkonidae)," *Journal of Zoology London* 176:437-476.

Spice, B. (Jul. 2003). "Scientists Unravel Mystery of Gecko's Sticky Feet," post-gazette.com Health & Science, located at <http://www.post-gazette.com/healthscience/20030707gecko0707p2.asp> visited on Jun. 19, 2007. (4 pages).

Stork, N. E. (Oct. 1980). "Experimental Analysis of Adhesion of Chrysolina polita (Chrysomelidae: Coleoptera) on a Variety of Surfaces," *Journal of Experimental Biology* 88: 91-107.

Stork, N. E. (Mar. 1980). "A Scanning Electron Microscope Study of Tarsal Adhesive Setae in the Coleoptera" *Zoological Journal of the Linnean Society* 68: 173-306.

Thurn-Albrecht, T. et al. (Dec. 2000). "Ultrahigh-Density Nanowire Arrays Grown in Self-Assembled Diblock Copolymer Templates," *Science* 290:2126-2129.

Williams, E. E. (Mar. 1982). "Convergent and Alternative Designs in the Digital Adhesive Pads of Scincid Lizards," *Science* 215: 1509-1511.

Supplemental European Search Report mailed Nov. 3, 2004, for Eurpoean Application No. 00993217.9 filed Dec. 11, 2000, 3 pages.

U.S. Appl. No. 11/271,103 filed Nov. 10, 2005 for Fearing et al.

Englander, O. et al. (Jun. 30, 2003). "Local Synthesis of Silicon Nanowires and Carbon Nanotubes on Microbridges," *Applied Physics Letters* 82(26):4797-4799.

* cited by examiner

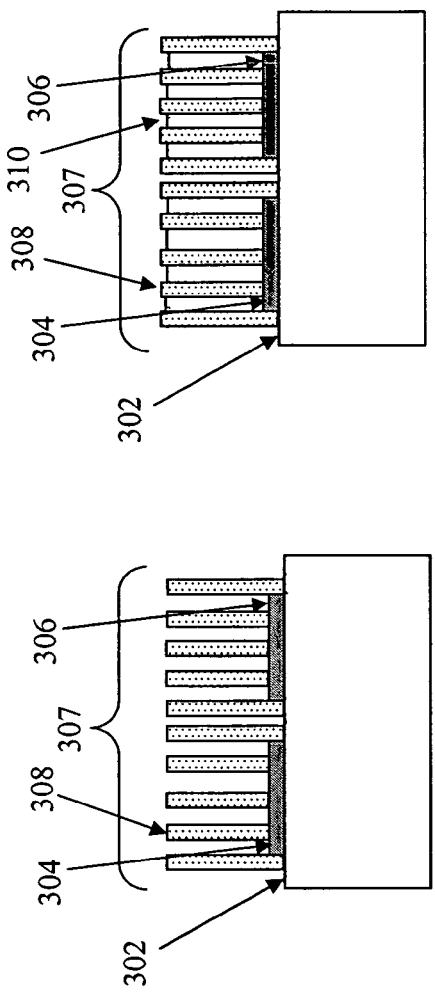
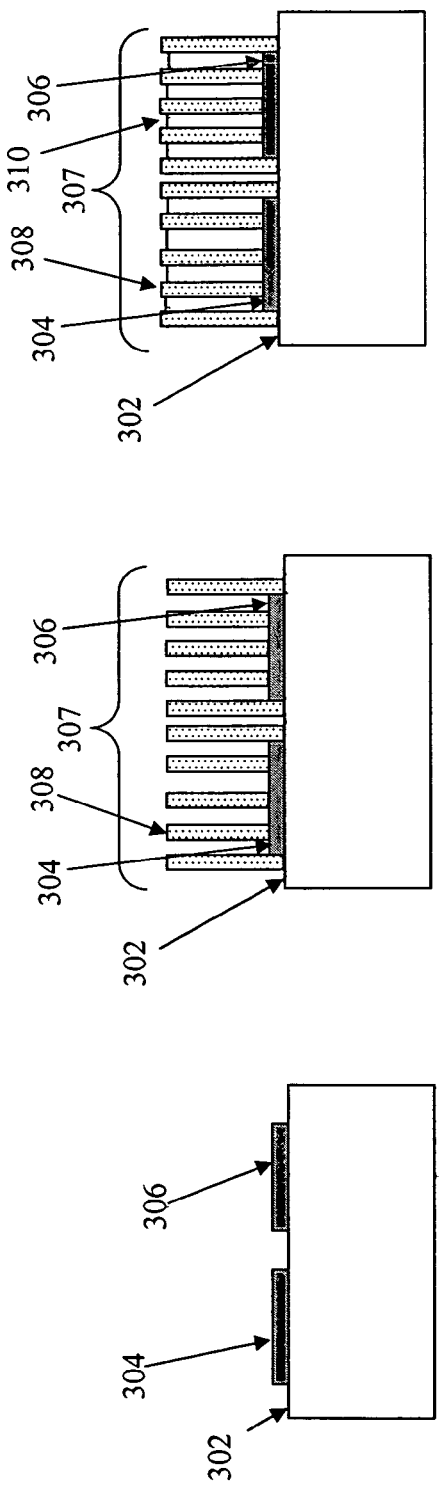
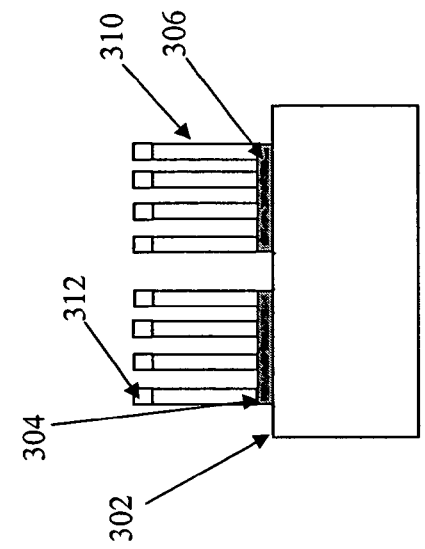
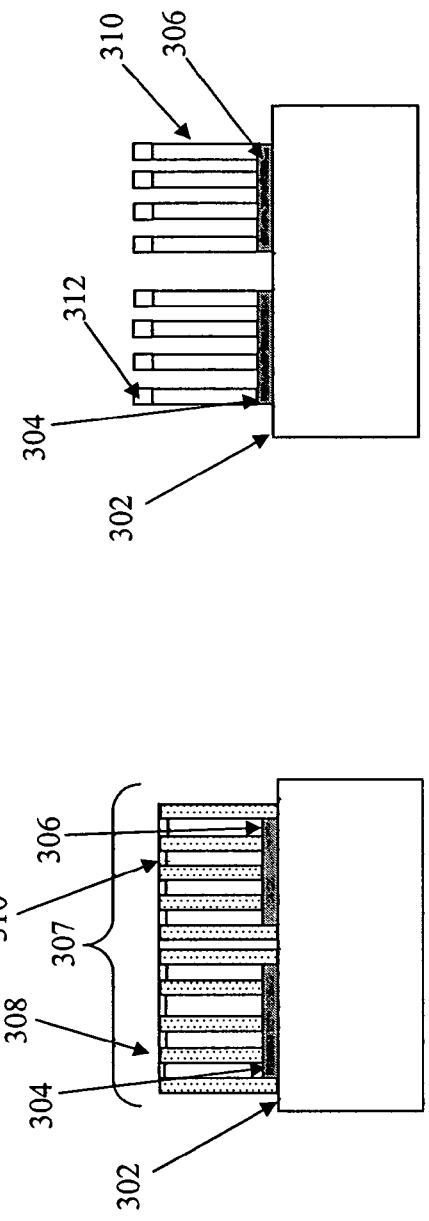
FIG. 3A
FIG. 3B
FIG. 3C
FIG. 3D
FIG. 3E

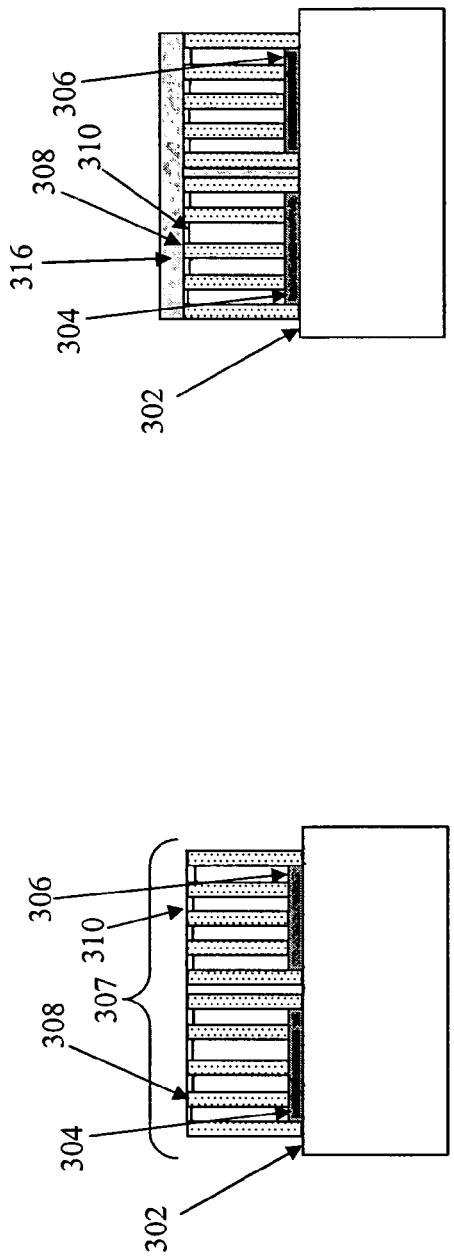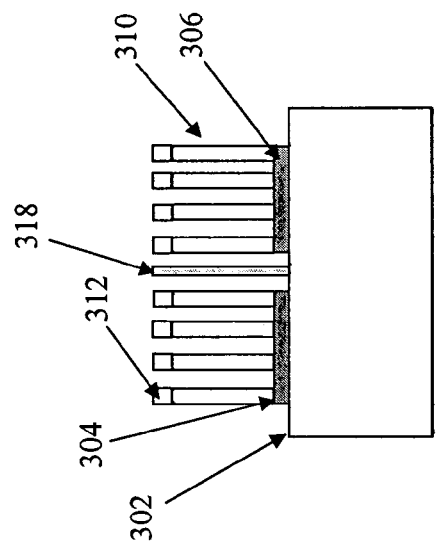

FABRICATED ADHESIVE MICROSTRUCTURES FOR MAKING AN ELECTRICAL CONNECTION

CROSS-REFERENCE TO RELATED APPLICATIONS

This application claims the benefit under 35 USC 119(e) of U.S. Provisional Application No. 60/657,665, filed Feb. 28, 2005, which is incorporated herein by reference in its entirety.

STATEMENT REGARDING FEDERALLY SPONSORED RESEARCH OR DEVELOPMENT

This invention was made with Government support under Grant (Contract) No. N66001-01-C-8072 awarded by the Defense Advanced Research Projects Agency (DARPA). The Government has certain rights in this invention.

BACKGROUND

1. Field

This application generally relates to the fabrication and utilization of micron-scale structures. More particularly, this application relates to making an electrical connection using micron-scale structures.

2. Related Art

Current integrated circuit mounting techniques use solder and a protective coating for electrical interfacing (solder pads and pin-outs) and mechanical stability (underfill). Traditionally, as integrated circuit manufacturing processes and circuit architectures advance, pin-out numbers increase, and silicon die areas can potentially decrease. Larger pin-out numbers are desirable for both increased potential inputs/outputs and power supply. Smaller die areas create more compact devices and decrease production costs per die. The trend towards larger pin-out numbers and smaller die areas creates trends toward smaller solder pads for interfacing with substrates.

Many modern integrated circuits use a technique known as controlled collapse chip connection (C4) to interface integrated circuits with a substrate. C4 begins with the formation of an array of small solder balls on the solder pads of an integrated circuit. The integrated circuit-solder ball assembly is then flipped over onto the substrate such that each solder ball lines up with its intended solder pad on the substrate. The solder balls are then re-flowed to ensure bonding to substrate solder pads, and the final solder joint shape is dictated by the surface tension of the particular solder employed and the weight of the integrated circuit pressing down on the molten solder.

Each soldering step used in the C4 process, however, uses temperatures high enough to potentially damage delicate integrated circuits. Also, decreasing solder ball size results in decreasing distance between silicon die and substrate, thus decreasing final solder joint thickness. Additionally, due to a coefficient of thermal expansion mismatch between silicon die and substrate, solder joints are subject to considerable stress during temperature change and fatigue during temperature cycle. Such mechanisms may induce cracks in solder joints, leading to solder joint failure and integrated circuit malfunction.

SUMMARY

In one exemplary embodiment, an integrated circuit chip has one or more electrically conductive nano-fibers formed on one or more contact pads of the integrated circuit chip. The one or more electrically conductive nano-fibers are configured to provide an adhesive force by intermolecular forces and establish an electrical connection with one or more contact pads disposed on the surface of a chip package.

DESCRIPTION OF DRAWING FIGURES

FIGS. 3A-3E illustrate an exemplary process of forming conductive nano-fibers.

FIGS. 4A-4C illustrate an exemplary process of depositing an insulating layer.

DETAILED DESCRIPTION

Figure 1A:
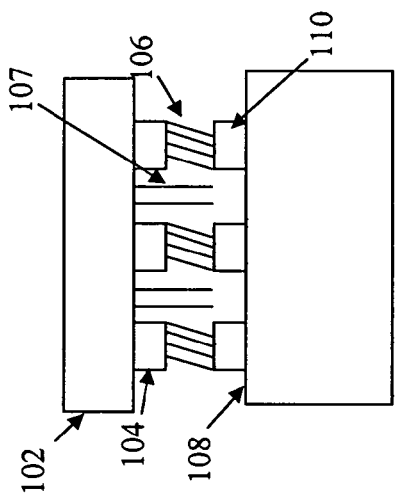
FIGS. 1A-1D illustrate an exemplary process of mounting a chip on a chip package.

FIGS. 1A-1D show the process of mounting chip 102 onto chip package 108. With reference to FIG. 1A, contact pads 104 are disposed on the surface of chip 102. Electrically conductive nano-fibers 106 are disposed on each contact pad 104. In addition, electrically non-conductive nano-fibers 107 are disposed on the surface of chip 102. Contact pads 110 are disposed on the surface of chip package 108. In FIG. 1A, nano-fibers 106 and 107 are not in contact with contact pads 110 or chip package 108.

Figure 1B:
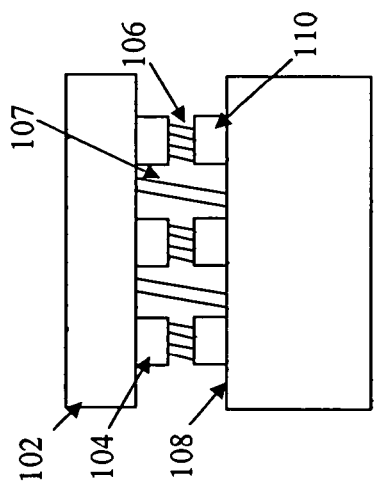

In FIG. 1B, nano-fibers 106 disposed on contact pads 104 engage contact pads 110. Nano-fibers 106 form an electrical connection between each contact pad 104 and corresponding contact pad 110. In FIG. 1B, non-conductive nano-fibers 107 are not in contact with chip package 108.

Figure 1C:
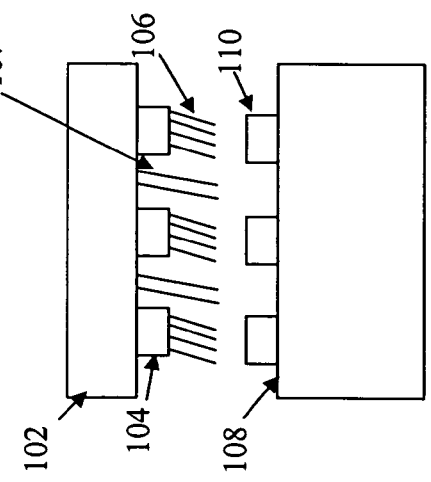

In FIG. 1C, contact pads 104 of chip 102 adhere to contact pads 110 of chip package 108. For optimal adhesion, nano-fibers 106 and nano-fibers 107 are "pre-loaded" onto contact pad 110 and chip package 108, respectively. In the first step of the pre-load, nano-fibers 106 and 107 are pushed into contact pad 110 and chip package 108, respectively, in the direction normal to the surface of contact pad 110 and chip package 108. In the second step of the pre-load, the nano-fibers 106 and 107 are pulled laterally along contact pad 110 and chip package 108. The perpendicular force in the direction normal to the surface of the contact pad 110 and chip package 108 combined with the lateral force along the respective surfaces of contact pad 110 and chip package 108 provides significantly enhanced adhesion to the contact pad 110 or chip package 108. In some embodiments, the force of adhesion can increase by 20 to 60-fold, and adhesive force parallel to the respective surfaces of contact pad 110 and chip package 108 can increase linearly with the perpendicular preloading force. In addition, "pre-loading" can increase the number of nano-fibers contacting the surface.

Figure 1D:
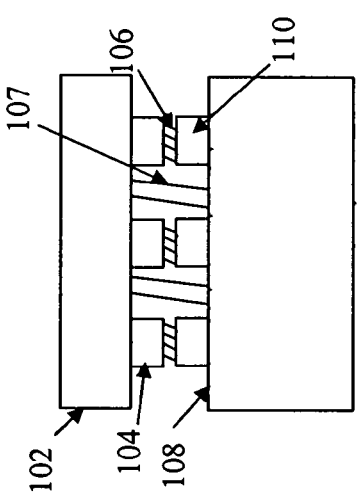

With respect to FIG. 1D, nano-fibers 106 are adhered to contact pads 110 of chip package 108. Further, nano-fibers 106 form an electrical connection between contact pads 104 and contact pads 110. Contact pads 104 on chip 102 are thus in electrical contact with the corresponding contact pads 110 of the chip package 108.

In certain embodiments, an electrostatic field between the nano-fibers 106 and contact pads 110 can be used to initiate contact between nano-fibers 106 and the contact pad 110. Applying an electrostatic field between the chip and contact ensures formation of an electrical connection through nano-fiber 106. An electrostatic field can also be used to create a programmable interconnect by connecting only certain contact pads 104 of the chip 102 to the chip package 108.

In other embodiments, chips can be constructed without nano-fibers 107. In certain embodiments, the chips can be constructed to contain an underfill.

Each of the nano-fibers 106 or 107 is capable of mimicking the adhesive properties of nano-fibrous spatulae situated on setae of a Tokay Gecko by engaging with and adhering to contact pad 110 or the surface of chip package 108 by van der Waals forces. In certain embodiments, the average force provided at a surface by nano-fiber 106 or 107, respectively, is between about 0.06 to 0.20 micro-Newton (between about 60 and 200 nano-Newtons). In other embodiments, the average force provided at a surface by each nano-fiber 106 and 107 is between about 1.00 and 200 nano-Newtons. In other embodiments, each nano-fiber 106 and 107 can provide a substantially normal adhesive force of between about 20 and 8,000 nano-Newtons. In still other embodiments, nano-fibers 106 or 107 can resist a substantially parallel shear force of between about 5 and 2,000 nano-Newtons.

For embodiments in which an array of nano-fibers is disposed on a contact pad or chip surface, it is not necessary for all nano-fibers in the array to adhere. For example, in cases where only 10% of an array having 1000 nano-fibers adheres to contact pad 110 with 2 micro-Newtons adhesive force per nano-fiber, the array adheres to contact pad 110 with 200 micro-Newton adhesive force. Providing millions of such nano-fibers at contact pad 110 provides significantly greater adhesion. Moreover, it will be understood that any number of contact pads can be disposed on the chip, and any number of nano-fibers can be disposed on the contact pads and/or chip.

To avoid nano-fiber tangling, nano-fibers are designed to be sufficiently stiff to be separated from each other, while dense enough to provide adhesive force. Arrays of nano-fibers can be constructed to prevent adhesion to each other. The adhesive force of a nano-fiber depends upon its three-dimensional orientation (nano-fibers pointing toward or away from the surface) and the extent to which the nano-fiber is preloaded (pushed into and pulled along the surface) during initial contact.

In other variations, nano-fibers are supported at an oblique angle (neither perpendicular nor parallel) relative to a contact surface such as a contact pad. This angle can be between about 15 and 75 degrees, and more preferably between about 30 degrees and 60 degrees. In the present embodiment, the angle is 30 degrees. In other embodiments, nano-fibers are not supported at an oblique angle, but at an angle perpendicular to a contact surface.

A further discussion of all such design characteristics of nano-fibers is found in U.S. Pat. No. 6,737,160 and U.S. patent application Ser. No. 10/197,763, each of which is hereby incorporated herein by reference in its entirety.

Nano-fibers can be oppositely oriented on different contact pads or at different locations on a chip pad to increase mechanical stability of chips mounted on chip packages. Nano-fibers can release from a contact surface such as a contact pad by "peeling" away from the surface. Such "peeling" motion is directional, and depends on the orientation of the nano-fiber with respect to the contact surface. Peeling is further described in, for example, U.S. Pat. No. 6,737,160 and U.S. patent application Ser. No. 10/197,763.

Figure 2:
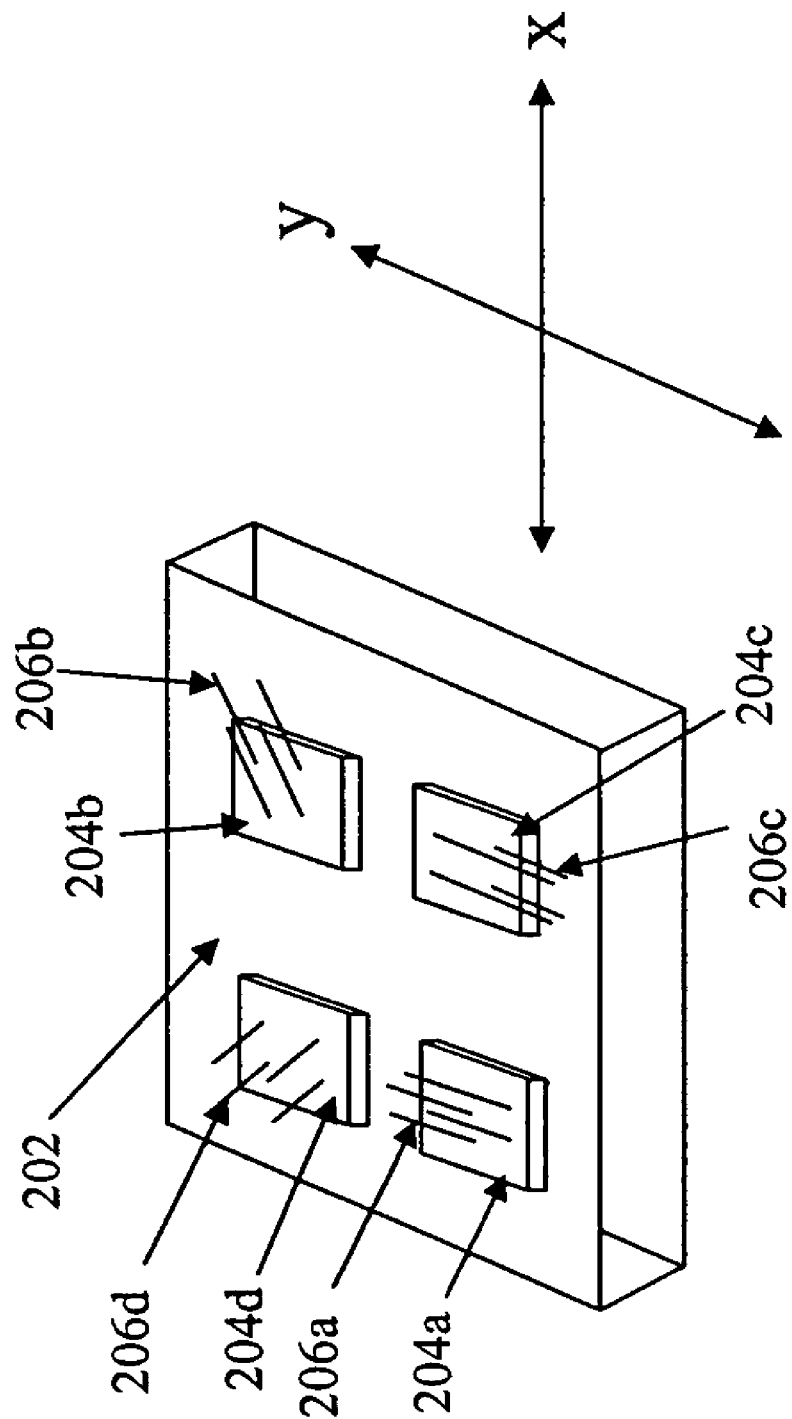
FIG. 2 depicts an exemplary chip with contact pads with arrays of nano-fibers oriented in different directions.

By orienting nano-fibers or arrays of nano-fibers in different directions with respect to the contact pad on the chip, nano-fibers cannot peel away in any single direction. One such example of orienting nano-fibers to improve adhesion is depicted in FIG. 2. Four contact pads 204a-d are disposed on chip 202. Separate arrays of nano-fibers 206a-d are disposed on each contact pad 204a-d, respectively. Each array of nano-fibers 206a-d is oriented in a different direction than the other arrays. Array of nano-fibers 206a is oriented away from the surface of contact pad 204a in the +y direction. Array of nano-fibers 206b is oriented away from the surface of contact pad 204b in the +x direction. Array of nano-fibers 206c is oriented away from the surface of contact pad 204c in the −y direction. Array of nano-fibers 206d is oriented away from the surface of contact pad 204d in the −x direction. When chip 202 is mounted on a chip package (not shown), the arrays of nano-fibers oriented in different directions prevent "peeling" of all the nano-fibers away from a contact surface in a single direction. Orienting nano-fibers in different directions thereby provides improved mechanical stability for chips mounted on chip packages.

Conductive nano-fibers can be disposed on other conductive structures. One example of such a conductive structure is a conductive shaft, such as a wire. Nano-fibers can be disposed on the terminus of a conductive wire allow adhesion of the wire to a contact surface. Supporting shafts can be between about 1 and 500 microns long, preferably approximately 10 to 150 microns long. The diameter of the shaft can be between about 1 and 10 microns. In other embodiments, a plurality of stalks can be disposed on the contact pad or chip, and a plurality of nano-fibers can be disposed at the terminus of each stalk.

In other embodiments, conductive nano-fibers disposed on contact pads or chip surfaces can be used to adhere chips to other parts. Nano-fibers can be used, for example, to adhere chips to printed circuit boards or other chips. Alternatively, nano-fibers can be used to adhere to printed circuit boards to other printed circuit boards. In other examples, nano-fibers can be disposed on silicon dies before the dies are cut into chips.

Nano-fibers can be disposed on chips or contact pads by any method known in the art. In one embodiment, nano-fibers can be disposed on a contact pad or chip by generating nano-fibers directly from the contact pad or chip surface.

FIGS. 3A-3E depicts another method of making conductive nano-fibers for connecting integrated circuits. With reference to FIG. 3A, contact pads 304 and 306 are disposed on chip 302. In FIG. 3B, a non-conductive mold array 307 with nano-pores 308 is disposed on the surface of chip 302. Any method of making an array of nano-pores can be used. For example, a mold of self-assembled nano-pores can be disposed on the chip 302 by the method described by Thurn-Albrecht, et al., *Ultrahigh-Density Nanowire Arrays Grown in Self-Assembled Diblock Copolymer Templates*, Science (2000) 290: 2126-2129.

With reference to FIG. 3C, nano-pores 308 serve as molds for nano-fibers 310. Conductive material is deposited within nano-pores 308. The conductive material hardens to form nano-fibers 310. When non-conductive mold array 307 is removed, conductive nano-fibers 310 disposed on the surface of the contact pads 304, 306 extend from the surface of chip 302.

In another embodiment, nano-fibers can be combined with conventional solder to provide a solder tip on each nano-fiber. With reference to FIG. 3D, solder 312 is deposited on top of nano-fibers 310. With reference to FIG. 3E, the non-conductive mold array is removed, leaving solder-tipped nano-fibers 310. When solder-tipped nano-fibers 310 are brought in contact with a surface and a voltage or current is applied across nano-fibers 310, the solder melts, bonding the nano-fiber to the surface. The solder bond is in addition to the adhesion created by contacting the nano-fiber to the surface.

In another variation, an insulating material can be formed on the chip surface. One method of depositing an insulating material on the chip surface is shown in FIGS. 4A-4C. With reference to FIG. 4A, solder 312 is deposited over nano-fibers 310, as described above in FIGS. 3A-D. With reference to FIG. 4B, insulating material 316 is deposited over solder 312 and between the portion of nonconductive mold array 307 that separates contact pads 304 and 306. With reference to FIG. 4C, when non-conductive mold array 307 and the excess insulating material are removed, groups of nano-fibers 310 on each contact pad 304 and 306 are insulated from each other by insulator 318.

The nano-fibers can also be manufactured in situ, for example by the method disclosed by Englander et al., "Local Synthesis of Silicon Nanowires and Carbon Nanotubes on Microbridges," Applied Physics Letters, Vol. 82, No. 26, pp. 4797-4799, June 2003.

Using nano-fibers to connect electrically conductive components can have other benefits based on the choice of nano-fiber materials. For instance, a single patch of conductive nano-fibers has a relatively low manufacturing cost. In addition, disposing conductive nano-fibers on contact pads and disposing non-conductive nano-fibers on the surface of a chip can reduce short circuits between chips and chip packages.

Although FIGS. 3A-E and FIGS. 4A-C depict fabrication of nano-fibers normal to the contact surface, it will be recognized that the fabricated nano-fibers may be constructed to have any characteristic, including those discussed in U.S. Pat. No. 6,737,160 and U.S. patent application Ser. No. 10/197,763.

All publications, patents, and patent applications cited herein are hereby incorporated by reference in their entirety for all purposes to the same extent as if each individual publication, patent, or patent application were specifically and individually indicated to be so incorporated by reference. Although certain embodiments have been described in some detail by way of illustration and example for purposes of clarity of understanding, it is readily apparent to those of ordinary skill in the art, in light of the teachings of this application, that certain changes and modifications can be made thereto without departing from the spirit and scope of the application.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. An integrated circuit chip comprising:
a chip surface;
one or more contact pads disposed on the chip surface; and
one or more electrically conductive nano-fibers formed on the one or more contact pads, the one or more electrically conductive nano-fibers configured to provide an adhesive force by intermolecular forces and establish an electrical connection with one or more contact pads disposed on the surface of a chip package.

2. The integrated circuit chip of claim 1, further comprising one or more electrically non-conductive nano-fibers disposed on the chip surface, each of the one or more electrically non-conductive nano-fibers configured to provide an adhesive force by intermolecular forces with the surface of the chip package.

3. The integrated circuit chip of claim 1, wherein each of the one or more electrically conductive nano-fibers has a first end and an opposite second end, wherein each nano-fiber is formed with the first end formed on the one or more contact pads disposed on the chip surface, and wherein the second end of each nano-fiber is configured to adhere to the contact pads on the surface of the chip package.

4. An integrated circuit chip comprising:
a chip surface;
one or more contact pads disposed on the chip surface; and
an array of electrically conductive nano-fibers formed on the one or more contact pads, each nano-fiber of the array of nano-fibers having a first end and an opposite second end, wherein the first end of each nano-fiber is affixed to the one or more contact pads, wherein the second end of each nano-fiber is configured to adhere to the one or more contact pads disposed on a chip package, printed circuit board, or another chip to provide an adhesive force by intermolecular forces and establish an electrical connection with the one or more contacts disposed on the chip package, printed circuit board, or another chip.

5. The integrated circuit chip of claim 4, further comprising an array of electrically non-conductive nano-fibers disposed on the chip surface, each of the electrically non-conductive nano-fibers configured to provide an adhesive force by intermolecular forces with the surface of the chip package, printed circuit board, or another chip.

6. The integrated circuit chip of claim 4 wherein each electrically conductive nano-fiber is aligned at an oblique angle relative to the contact pad, printed circuit board, or another chip.

7. The integrated circuit chip of claim 6 wherein the oblique angle is between about 15 and 75 degrees.

8. The integrated circuit chip of claim 6 wherein the oblique angle is between about 30 and 60 degrees.

9. The integrated circuit chip of claim 6 wherein the oblique angle is about 30 degrees.

10. The integrated circuit chip of claim 4 wherein each electrically conductive nano-fiber is capable of providing a substantially normal adhesive force of between about 20 and 8,000 nano-Newtons.

11. The integrated circuit chip of claim 4 wherein each electrically conductive nano-fiber is capable of providing a substantially parallel adhesive force of between about 5.00 and 2,000 nano-Newtons.

12. The integrated circuit chip of claim 4 wherein each electrically conductive nano-fiber is capable of providing an adhesive force of between about 1.00 and 200 nano-Newtons.

13. The integrated circuit chip of claim 4 wherein the one or more contact pads includes a first contact pad and at least a second contact pad, wherein the array of electrically conductive nano-fibers includes a first array formed on the first contact pad and a second array formed on the at least second contact pad, and wherein the electrically conductive nano-fibers in the first array are oriented in a different direction than the electrically conductive nano-fibers in the second array.

* * * * *